United States Patent [19]

Yu et al.

[11] Patent Number: 5,922,516
[45] Date of Patent: Jul. 13, 1999

[54] BI-LAYER SILYLATION PROCESS

[75] Inventors: Chen-Hua Yu; Chia-Shiung Tsai, both of Hsin-Chu, Taiwan

[73] Assignee: Taiwan Semiconductor Manufacturing Company, Ltd., Hsin-Chu, Taiwan

[21] Appl. No.: 08/868,677

[22] Filed: Jun. 4, 1997

[51] Int. Cl.[6] ...................................................... G03F 7/38
[52] U.S. Cl. ........................................... 430/314; 430/316
[58] Field of Search .................................... 430/311, 313, 430/314, 316, 322, 324

[56] References Cited

U.S. PATENT DOCUMENTS

| | | | |
|---|---|---|---|
| 4,657,629 | 4/1987 | Bigelow | 156/643 |
| 5,427,649 | 6/1995 | Kim et al. | 156/661.11 |
| 5,455,145 | 10/1995 | Tarumoto | 430/325 |
| 5,525,192 | 6/1996 | Lee et al. | 156/651.1 |
| 5,726,094 | 3/1998 | Schwalke | 438/561 |

*Primary Examiner*—Kathleen Duda
*Attorney, Agent, or Firm*—George O. Saile; Stephen B. Ackerman; Rosemary L. S. Pike

[57] ABSTRACT

A new method of improving critical dimension control by using a silylation process with a cross-linked photoresist underlayer is described. A layer to be etched is provided on a semiconductor substrate wherein the surface of the layer has an uneven topography. The layer to be etched is coated with a first photoresist layer. The first photoresist layer is baked. The first photoresist layer is coated with a second photoresist layer. A portion of the second photoresist layer not covered by a mask is exposed to actinic light. Thereafter, the exposed portion of the second photoresist layer is baked, then silylated. The silylated portion of the second photoresist layer and the underlying first photoresist layer forms the photomask. The remaining second and first photoresist layers not covered by the photomask are etched away. The layer to be etched is etched away where it is not covered by the photomask and the photomask is removed to complete the photoetching having uniform critical dimension in the fabrication of an integrated circuit.

27 Claims, 5 Drawing Sheets

BI-LAYER SILYLATION PROCESS

BACKGROUND OF THE INVENTION (1) Field of the Invention

The invention relates to a method of fabricating a photoresist mask, and more particularly, to a method of fabricating a bi-layer photoresist mask that will improve critical dimension control in the manufacture of integrated circuits.

(2) Description of the Prior Art

Device sizes continue to shrink as semiconductor manufacturing processes are improved. Continuing advancement in the production of ever smaller devices is limited by photolithography techniques. Dry development processes, such as silylation, can increase the overall process window for micro-patterning techniques. Dry development processes can improve resolution and depth of focus and result in more vertical resist profiles. However, proximity effect and thinning effects exist which make post-silylation critical dimension control challenging. Proximity effect refers to the phenomenon in which a pattern element adjacent to another pattern element receives light exposure not only from the incident light waves, but also from light waves reflected from the adjacent element. As pattern elements become closer together, the proximity effect is more pronounced. Thinning effects occur when a thin layer of photoresist is used. In certain areas, all of the photoresist may be etched away exposing areas of the underlying layer which should not be exposed. The edge profile of the silylated region determines the post dry-development critical dimension control. A vertical profile, achievable with dry etching, improves critical dimension control.

U.S. Pat. No. 5,455,145 to Tarumoto discloses a double layer resist mask. U.S. Pat. No. 4,657,629 to Bigelow teaches a double layered resist mask in which the first layer of resist is baked and entirely exposed to ultraviolet light. U.S. Pat. No. 5,427,649 to Kim et al teaches a double layer of resist film in which a portion of the first resist film is silylated before the second layer resist is formed. U.S. Pat. No. 5,525,192 to Lee et al disclose a process in which silylation and an alkali surface treatment of the resist are performed in parallel.

SUMMARY OF THE INVENTION

A principal object of the present invention is to provide an effective and very manufacturable method of providing improved critical dimension control in photolithography.

Another object of the present invention is to provide a method of fabricating a photoresist mask with improved critical dimension control.

A further object of the present invention is to provide a method of fabricating a photoresist mask with improved critical dimension control using a silylation process.

Yet another object is to provide a method of fabricating a photoresist mask using silylation wherein the proximity effect of the photolithography process is eliminated.

Yet another object is to provide a method of fabricating a photoresist mask using silylation wherein the proximity effect of the photolithography process is eliminated by using a cross-linked photoresist underlayer.

In accordance with the objects of this invention a new method of improving critical dimension control by using a silylation process with a cross-linked photoresist underlayer is achieved. A layer to be etched is provided on a semiconductor substrate wherein the surface of the layer has an uneven topography. The layer to be etched is coated with a first photoresist layer. The first photoresist layer is baked. The first photoresist layer is coated with a second photoresist layer. A portion of the second photoresist layer not covered by a mask is exposed to actinic light. Thereafter, the exposed portion of the second photoresist layer is baked, then silylated. The silylated portion of the second photoresist layer and the underlying first photoresist layer forms the photomask. The remaining second and first photoresist layers not covered by the photomask are etched away. The layer to be etched is etched away where it is not covered by the photomask and the photomask is removed to complete the photoetching having uniform critical dimension in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Referring to FIGS. 1–9, fabrication and use of a photoresist mask for etching polysilicon gate electrodes will be illustrated and discussed. However, it will be appreciated by those skilled in the art that the process of the present invention can be used in any other photolithography application as well, such as in local oxidation of silicon (LOCOS) or shallow trench isolation (STI).

Figure 1:
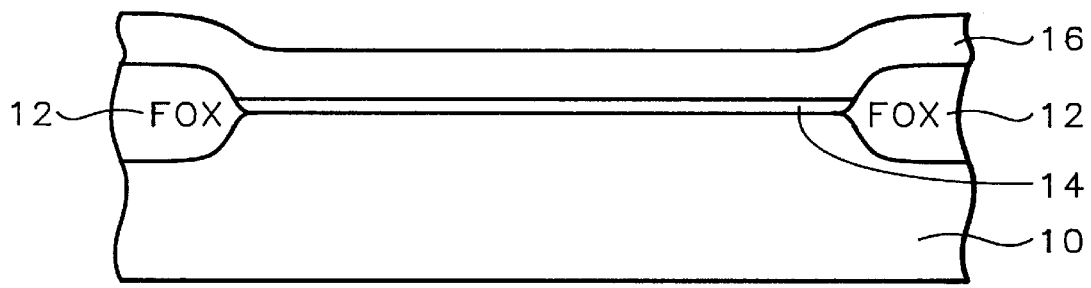
FIGS. 1 through 8 schematically illustrate in cross-sectional representation one preferred embodiment of the present invention.

Referring now more particularly to FIG. 1, a portion of a partially completed integrated circuit device is illustrated. A semiconductor substrate 10 is shown, preferably composed of monocrystalline silicon. Field oxide regions 12 have been formed as is conventional in the art in the semiconductor substrate 10 resulting in an uneven topography of the surface of the substrate.

A layer of gate silicon oxide 14 is grown over the surface of the semiconductor substrate and the field oxide regions. A layer 16 of polysilicon or polycide is deposited over the uneven surface of the substrate to a thickness of, for example, between about 2000 and 3000 Angstroms. According to the process of the present invention, a polycide or polysilicon gate electrode having a width of as small as about 0.18 microns can be fabricated.

Figure 2:
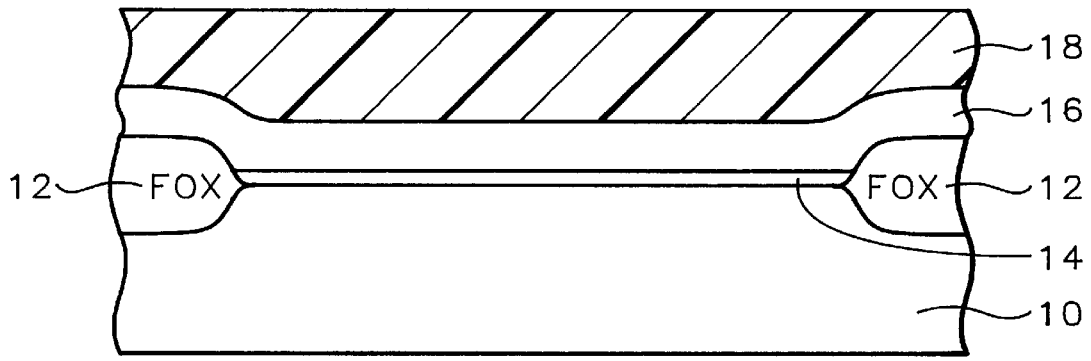

Referring now to FIG. 2, a first underlayer of photoresist 18 is coated onto the polysilicon layer 16 to a thickness of between about 3000 and 15,000 Angstroms. This photoresist layer is thick enough to be planarized at its top surface. The photoresist layer 18 may be either a negative-tone or a positive-tone photoresist. The photoresist underlayer 18 is baked at a temperature of between about 110 and 140° C. for a duration of between about 1 and 2 minutes. This baking will achieve cross-linking within the photoresist layer 18. That is, the resin component of the photoresist and the photo-active compound are cross-linked. This will transform the photoresist layer 18 into a silylation stop layer to reduce both the proximity effect and thinning effects. The first cross-linked photoresist underlayer and the dry etching chemistry can be chosen to best optimize the selectivity of the dry development process and the dry etch rate of the underlayer photoresist, and so improve final critical dimension control.

Figure 3:
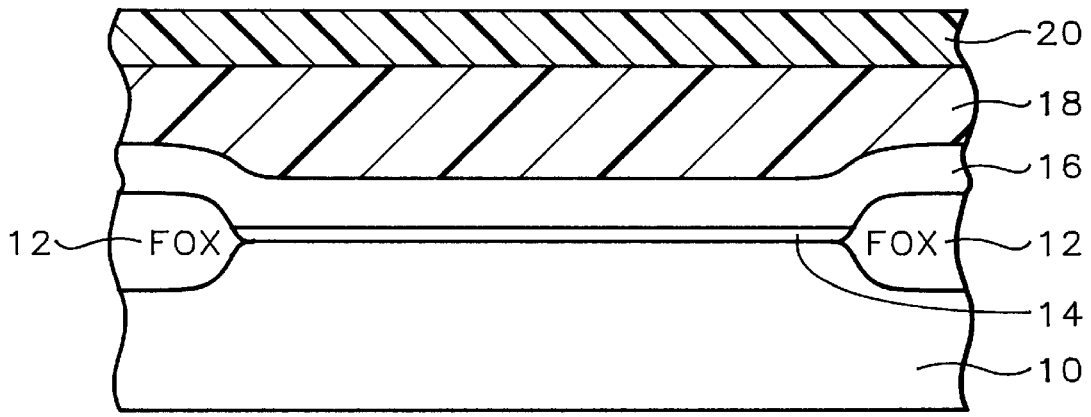

Referring now to FIG. 3, the second photoresist layer 20 is coated overlying the first photoresist underlayer 18. Photoresist layer 20 may be either a negative-tone or positive-tone photoresist and has a thickness in the range of 3000 to 5000 Angstroms. A negative-tone photoresist process is illustrated. Since the bulk of the photoresist thickness is in the planarized underlayer 18, only the top thinner portion of the photoresist bi-layer must be subjected to the more expensive silylation process. The thinner photoresist layer 20 also reduces the proximity effect.

Figure 4:
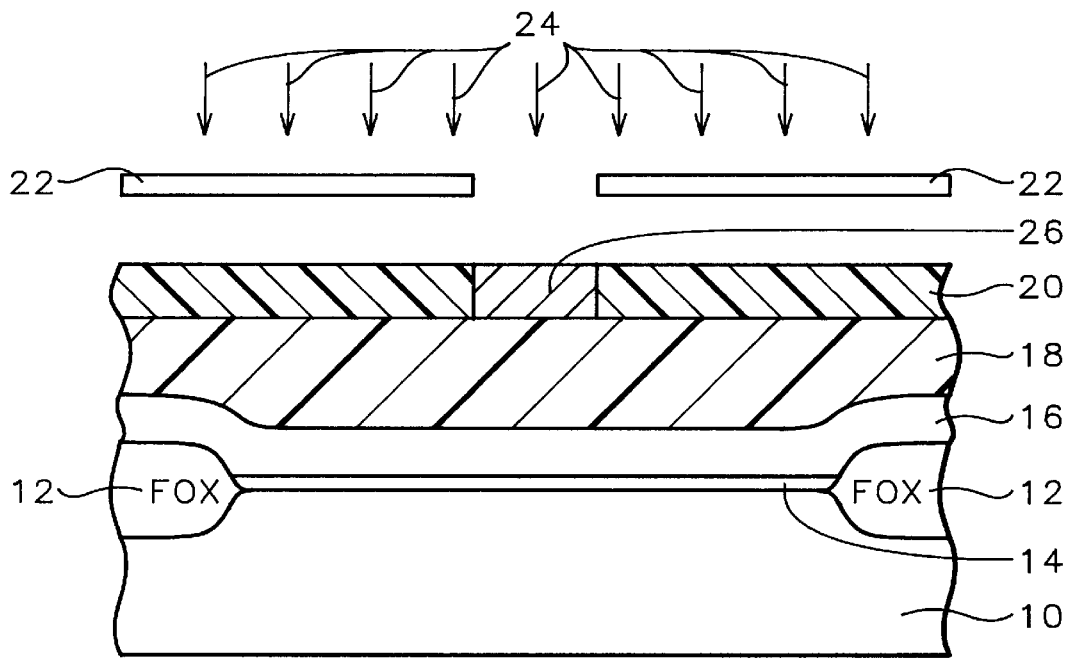

Referring now to FIG. 4, the photoresist layer 20 is exposed to actinic light 24 through a mask 22. The portion 26 not blocked by the mask 22 is exposed. The substrate is baked to cross-link the exposed portion 26 of the photoresist layer 20. The layer is baked at a temperature of between about 100 and 140° C. for 1 to 3 minutes.

Figure 5:
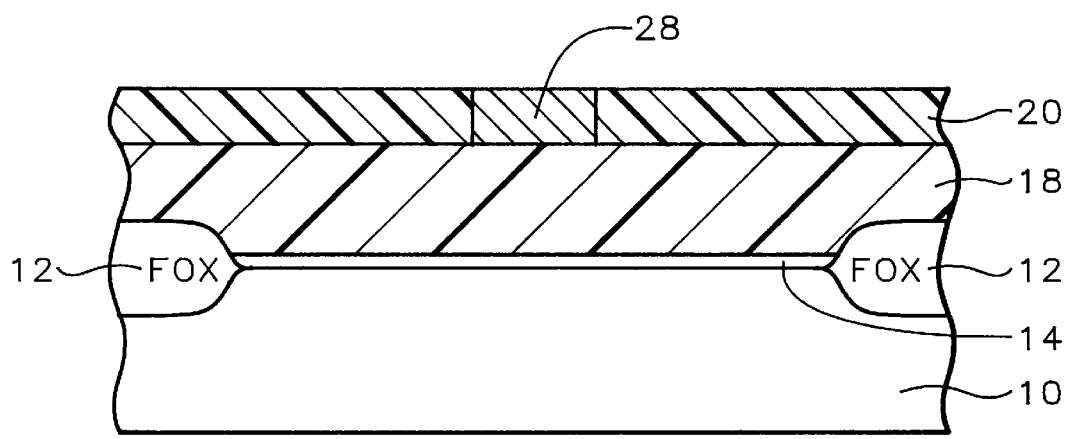

Next, as illustrated in FIG. 5, the photoresist layer 20 is silylated. Silylation will make the exposed portion of the photoresist layer resistant to the dry etchant, such as $O_2$ reactive ion etching (RIE). During silylation, the photoresist is heated in an atmosphere containing a silylation agent. The photoresist is heated to a temperature of between about 100 and 170° C. for 1 to 3 minutes. Typical silylation agents include N,N Diethylaminotrimethylsilane (TMSDEA), 1,1,3,3-Tetramethyldisilazane (TMDS), Trimethylsilyldimethylamine (TMSDMA), Dimethylsilyldiethylamine (DMSDEA), and Dimethylsilyldimethylamine (DMSDMA). The hydrogen-containing radicals in the exposed portion of the photoresist 26 are displaced by silicon atoms in the silylating agent to form silylated layer 28.

Figure 6:
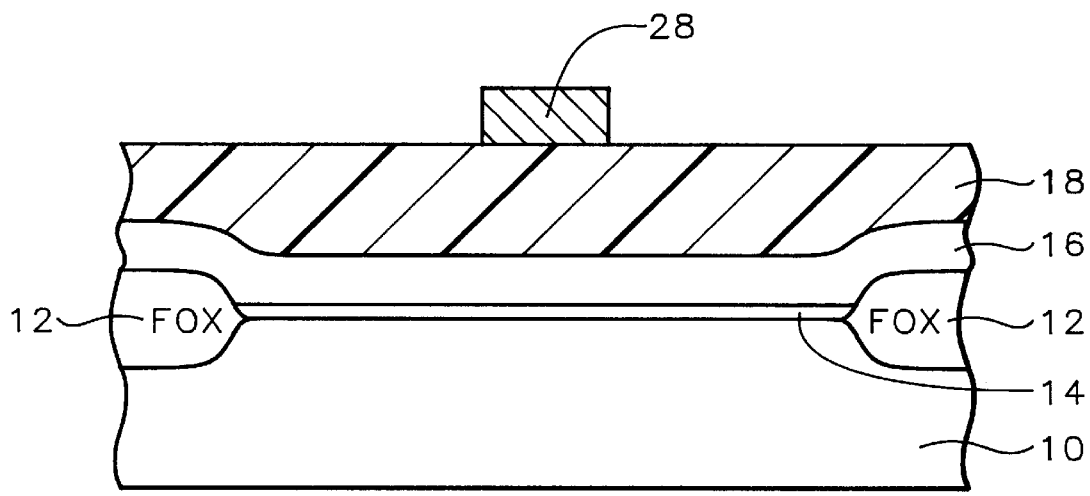

Referring now to FIG. 6, the photoresist 20 is developed by dry etching such as by RIE using $O_2$ or $SO_2/O_2$ leaving the silylated portion 28 of the photoresist as a photomask. The silylation layer 28 blocks the dry etchant so that the underlying resist remains.

Figure 7:
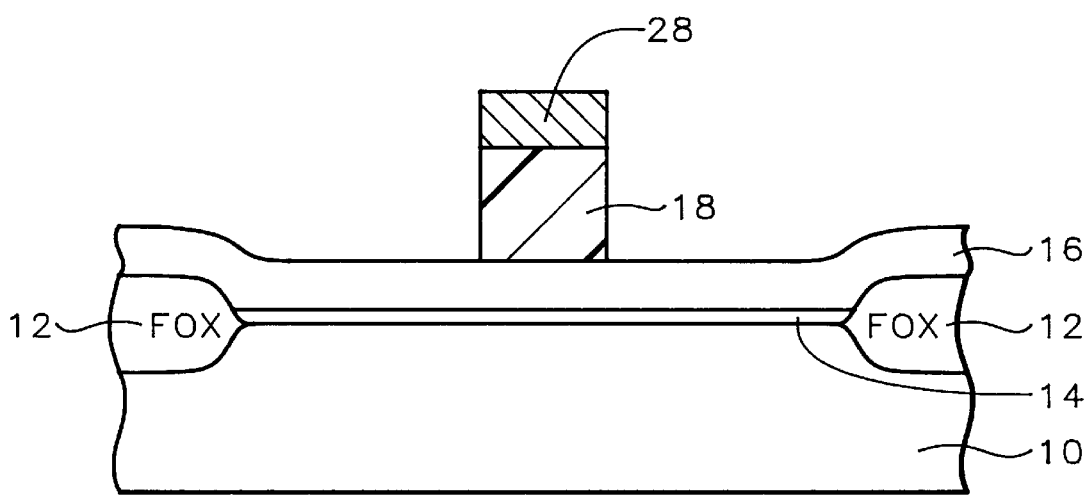

The photoresist underlayer 18 also is etched away where it is not covered by the photomask 28, as shown in FIG. 7. The dry etching to remove the unexposed photoresist 20 and the photoresist 18 not covered by the photomask may be a single step.

Figure 8:
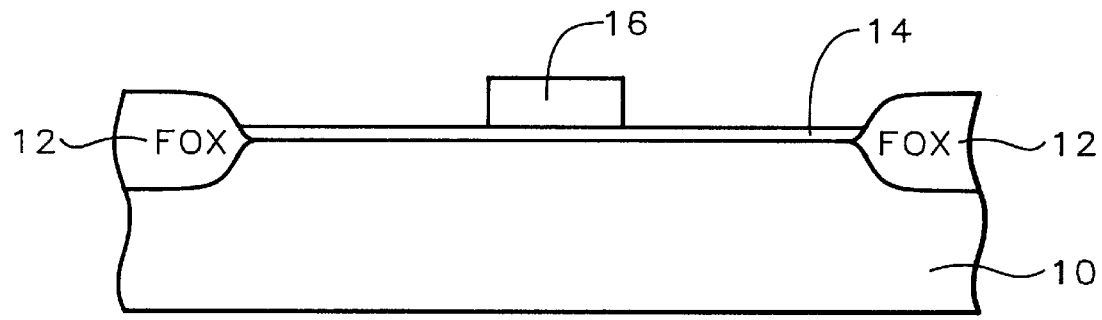

Referring now to FIG. 8, the layer 16 is etched away where it is not covered by the photomask to form polysilicon or polycide gate 16. The remaining photoresist is removed, for example, by $O_2$ plasma and $H_2SO_4/H_2O_2$.

Figure 9:
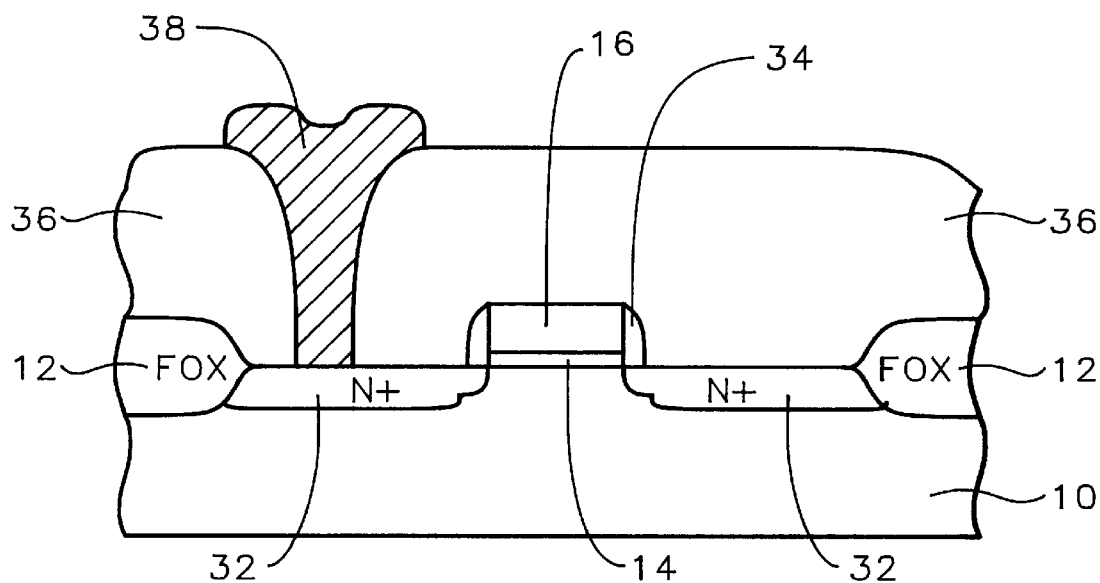
FIG. 9 schematically illustrates in cross-sectional representation a completed integrated circuit device fabricated by the process of the present invention.

Processing continues as is conventional in the art. For example, as shown in FIG. 9, source and drain regions may be formed in the semiconductor substrate, such as N+ regions 32. Silicon oxide spacers 34 may be formed on the sidewalls of the gate electrode 16. The semiconductor device structures may be covered by a thick dielectric layer 36. Openings are made through the dielectric layer 36 to underlying semiconductor structures such as source/drain region 32. A conducting layer may be deposited and patterned to complete electrical connections 38 to the underlying device structures.

Figure 10:
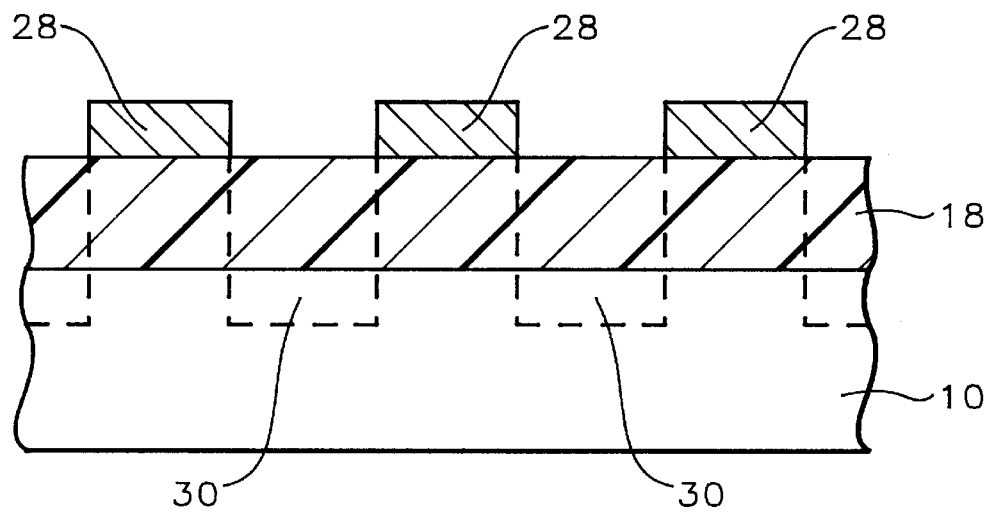
FIG. 10 schematically illustrates in cross-sectional representation a second preferred embodiment of the present invention.
Figure 11:
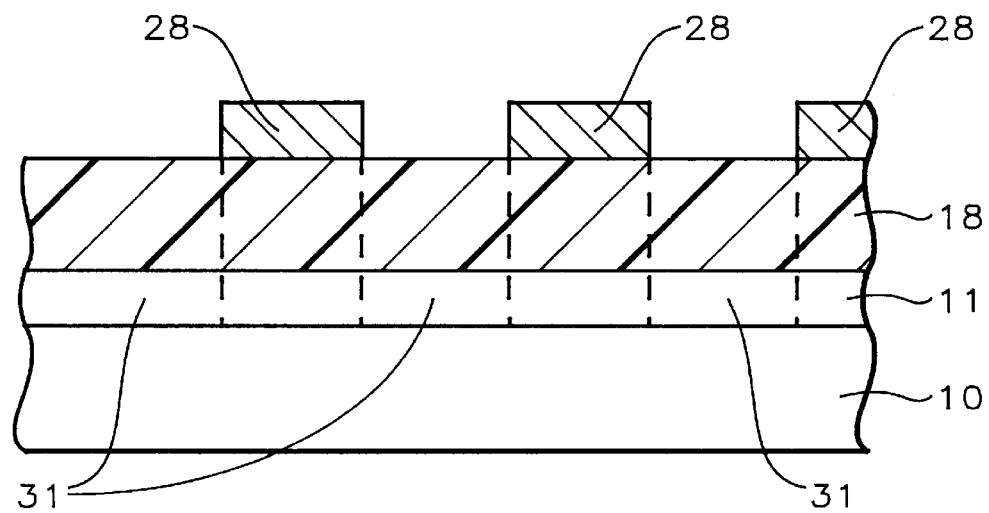
FIG. 11 schematically illustrates in cross-sectional representation a third preferred embodiment of the present invention.

FIGS. 10 and 11 illustrate other examples of applications in which the process of the invention can be used. FIG. 10 illustrates a semiconductor substrate 10 in which shallow trench isolation regions 30 are to be formed. FIG. 11 illustrates a semiconductor substrate 10 covered by a silicon nitride layer 11. In both figures, first photoresist underlayer 18 is shown covered by silylated second photoresist areas 28. The process of the invention is the same as described above with reference to FIGS. 2 through 8. The dotted lines illustrate where the photoresist will be etched away. In FIG. 10, the dotted lines also show where the trenches 30 will be etched into the substrate using the bi-layer photomask topped by silylated areas 28. The trenches will then be filled with a dielectric material to form shallow trench isolation areas. In FIG. 11, the dotted lines also show where the silicon nitride will be etched away from areas 31. The silicon exposed within these areas 31 will then be oxidized to form LOCOS isolation areas.

The process of the present invention results in a uniform circuit critical dimension without proximity effect or thinning effects. The bi-layer photoresist mask allows for an increased process window for micro-patterning techniques. The process of the invention can be used for patterning devices as small as 0.18 microns.

While the invention has been particularly shown and described with reference to the preferred embodiments thereof, it will be understood by those skilled in the art that various changes in form and details may be made without departing from the spirit and scope of the invention.

What is claimed is:

1. A method of providing a uniform critical dimension during photoetching in the fabrication of an integrated circuit comprising:

providing a layer to be etched on a semiconductor substrate wherein the surface of said layer has an uneven topography;

coating said layer to be etched with a first photoresist layer wherein said first photoresist layer is planarized;

baking said first photoresist layer;

coating the baked said first photoresist layer with a second photoresist layer;

exposing a portion of said second photoresist layer not covered by a mask to actinic light to form an exposed portion of said second photoresist layer;

thereafter baking said second photoresist layer;

silylating said exposed portion of said second photoresist layer whereby said exposed portion becomes a silylated portion of said second photoresist layer wherein said silylated portion of said second photoresist layer forms a photomask;

thereafter dry etching away said second and first photoresist layers not covered by said photomask;

etching away said layer to be etched where it is not covered by said photomask; and removing said photomask to complete said photoetching having said uniform critical dimension in the fabrication of said integrated circuit.

2. The method according to claim 1 wherein said layer to be etched comprises polysilicon having a thickness of between about 2000 and 3000 Angstroms and wherein gate electrodes are to be formed.

3. The method according to claim 1 wherein said layer to be etched comprises polycide having a thickness of between about 2000 and 3000 Angstroms and wherein gate electrodes are to be formed.

4. The method according to claim 1 wherein said layer to be etched comprises silicon and wherein shallow trench isolation areas are to be formed.

5. The method according to claim 1 wherein said layer to be etched comprises silicon nitride and wherein local oxidation of silicon (LOCOS) areas are to be formed.

6. The method according to claim 1 wherein said first photoresist layer is coated to a thickness of between about 3000 and 15,000 Angstroms.

7. The method according to claim 1 wherein said first photoresist layer is baked at a temperature of between about 110 and 140° C. for 1 to 2 minutes.

8. The method according to claim 1 wherein said second photoresist layer is coated to a thickness of between about 3000 and 5000 Angstroms.

9. The method according to claim 1 wherein said second photoresist layer is baked at a temperature of between about 100 and 140° C. for 1 to 3 minutes.

10. The method according to claim 1 wherein said exposed portion of said second photoresist layer is silylated at a temperature of between about 100 and 170° C. for 1 to 3 minutes.

11. The method according to claim 1 wherein said first and second photoresist layers not covered by said photomask are dry etched using $O_2$ plasma.

12. The method according to claim 1 wherein said first and second photoresist layers not covered by said photomask are dry etched using $SO_2/O_2$ plasma.

13. The method according to claim 1 wherein said photomask is removed by $O_2$ plasma.

14. The method according to claim 1 wherein said photomask is removed by $H_2SO_4/H_2O_2$.

15. A method of fabricating a bi-layer photomask in the fabrication of an integrated circuit comprising:

providing a layer to be etched on a semiconductor substrate wherein the surface of said layer has an uneven topography;

coating said layer to be etched with a first photoresist layer having a thickness of between 3000 and 15,000 Angstroms wherein said first photoresist layer is planarized;

baking said first photoresist layer;

coating the baked said first photoresist layer with a second photoresist layer having a thickness of between 3000 and 5000 Angstroms;

exposing a portion of said second photoresist layer not covered by a mask to actinic light to form an exposed portion of said second photoresist layer;

thereafter baking said exposed portion of said second photoresist layer;

silylating said exposed portion of said second photoresist layer whereby said exposed portion becomes a silylated portion of said second photoresist layer; and dry etching away said second and first photoresist layers not covered by said silylated portion of said second photoresist layer wherein said silylated portion of said second photoresist layer and said underlying portion of said first photoresist layer said bi-layer photomask in the fabrication of said integrated circuit.

16. The method according to claim 15 further comprising:

etching away said layer to be etched where it is not covered by said bi-layer photomask; and removing said photomask to complete fabrication of said integrated circuit device.

17. The method according to claim 16 wherein said layer to be etched comprises polysilicon having a thickness of between about 2000 and 3000 Angstroms and wherein gate electrodes are to be formed.

18. The method according to claim 16 wherein said layer to be etched comprises polycide having a thickness of between about 2000 and 3000 Angstroms and wherein gate electrodes are to be formed.

19. The method according to claim 16 wherein said layer to be etched comprises silicon and wherein shallow trench isolation areas are to be formed.

20. The method according to claim 16 wherein said layer to be etched comprises silicon nitride and wherein local oxidation of silicon (LOCOS) areas are to be formed.

21. The method according to claim 15 wherein said first photoresist layer is baked at a temperature of between about 110 and 140° C. for 1 to 2 minutes.

22. The method according to claim 15 wherein said second photoresist layer is baked at a temperature of between about 100 and 140° C. for 1 to 3 minutes.

23. The method according to claim 15 wherein said exposed portion of said second photoresist layer is silylated at a temperature of between about 100 and 170° C. for 1 to 3 minutes.

24. The method according to claim 15 wherein said first and second photoresist layers not covered by said photomask are dry etched using $SO_2/O_2$ plasma.

25. A method of fabricating a gate electrode using a bi-layer photomask in the fabrication of an integrated circuit comprising:

providing a polysilicon layer on a semiconductor substrate wherein the surface of said polysilicon layer has an uneven topography;

coating said polysilicon layer with a first photoresist layer wherein said first photoresist layer is planarized;

baking said first photoresist layer;

coating the baked said first photoresist layer with a second photoresist layer;

exposing a portion of said second photoresist layer not covered by a mask to actinic light to form an exposed portion of said second photoresist layer;

thereafter baking said exposed portion of said second photoresist layer;

silylating said exposed portion of said second photoresist layer whereby said exposed portion becomes a silylated portion of said second photoresist layer;

dry etching away said second and first photoresist layers not covered by said silylated portion of said second photoresist layer wherein said silylated portion of said second photoresist layer and said first photoresist layer covered by said silylated portion of said second photoresist layer form said bi-layer photomask;

etching away said polysilicon layer where it is not covered by said bi-layer photomask; and removing said photomask to complete fabrication of said gate electrode in the fabrication of said integrated circuit device.

26. The method according to claim 25 wherein said first photoresist layer is coated to a thickness of between about 3000 and 15,000 Angstroms.

27. The method according to claim 25 wherein said second photoresist layer is coated to a thickness of between about 3000 and 5000 Angstroms.

* * * * *